(12) United States Patent
Selvamanickam et al.

(10) Patent No.: US 7,226,893 B2
(45) Date of Patent: Jun. 5, 2007

(54) SUPERCONDUCTIVE ARTICLES HAVING DENSITY CHARACTERISTICS

(75) Inventors: Venkat Selvamanickam, Wynantskill, NY (US); Drew W. Hazelton, Selkirk, NY (US); Yunfei Qiao, Schenectady, NY (US)

(73) Assignee: Superpower, Inc., Schenectady, NY (US)

( * ) Notice: Subject to any disclaimer, the term of this patent is extended or adjusted under 35 U.S.C. 154(b) by 0 days.

(21) Appl. No.: 11/063,784

(22) Filed: Feb. 23, 2005

(65) Prior Publication Data

US 2006/0186381 A1 Aug. 24, 2006

(51) Int. Cl.
- *H01B 12/00* (2006.01)
- *H01L 39/12* (2006.01)
- *H01F 6/00* (2006.01)

(52) U.S. Cl. ............ 505/236; 505/235; 505/237; 505/238; 505/239; 505/166; 505/877; 174/125.1; 29/599; 428/469; 428/701; 428/930; 252/500

(58) Field of Classification Search ........... 505/238, 505/239, 701, 230, 192, 166, 150; 420/528, 420/126, 417; 428/469, 701, 930; 252/518.1
See application file for complete search history.

(56) References Cited

U.S. PATENT DOCUMENTS

| | | | |
|---|---|---|---|
| 5,261,151 A | | 11/1993 | Ferrando et al. |
| 5,872,080 A * | | 2/1999 | Arendt et al. ............ 505/238 |
| 6,617,283 B2 * | | 9/2003 | Paranthaman et al. ..... 505/238 |
| 6,765,151 B2 * | | 7/2004 | Fritzemeier et al. ..... 174/125.1 |
| 6,849,580 B2 * | | 2/2005 | Norton et al. ............ 505/237 |
| 2002/0192508 A1 * | | 12/2002 | Norton et al. ............ 428/701 |
| 2004/0026118 A1 * | | 2/2004 | Muroga et al. ........... 174/125.1 |

FOREIGN PATENT DOCUMENTS

| | | |
|---|---|---|
| JP | 01-200518 A * | 8/1989 |
| JP | 07-073758 A * | 3/1995 |

OTHER PUBLICATIONS

Chi et al, "Formation of Metastable Phases of the Ni-Al system by Mechanical Milling," J. Materials on Line, 2005, pp. 1-7.*
NIST Property Data, "Orthorhobic Y:123 (YBa2Cu3Ox)," 2005, pp. 1-2.*
Reade Advanced Materials, "Magnesium Oxide," 2005, pp. 1-2.*
Key to Metals, "Properties and Applications of Titanium-6% Aluminum-4% Vanadium Alloy," 2005, pp. 1-5.*
Data Sheet, Haynes 242 Alloy, 2006, pp. 1-4.*
Data Sheet, Ni-Al-Alloy, Haussler, 2004, p. 1.*
Bhandyopadhyay et al, "The superconducting critical field and fluctuation conductivity in quench-condensed Ti1-x-Vx thin films," J. Phys. 1987(17), pp. 433-445.*
Selvamanickam et al, "High-Current Y-Ba-Cu-O Coated Conductor using Metal Organic Chemical-Vapor Deposition and Ion-Beam-Aqssisted Deposition," IEEE Transactions on Applied Superconductivity, 2001, 11(1), pp. 3379-3381.*

* cited by examiner

*Primary Examiner*—Mark Kopec
*Assistant Examiner*—Kallambella Vijayakumar
(74) *Attorney, Agent, or Firm*—Larson Newman Abel Polansky & White, LLP

(57) ABSTRACT

A superconductive article is disclosed, having a substrate a buffer layer overlying the substrate, and a superconductive layer overlying the buffer layer. According to embodiments, the article may have low density characteristics, associated with the article as a whole and/or individual layers of the article. The article may be embodied in the form of long length conductors, coiled long length conductors, and machines incorporating such coils, for example.

16 Claims, 2 Drawing Sheets

SUPERCONDUCTIVE ARTICLES HAVING DENSITY CHARACTERISTICS

CROSS-REFERENCE TO RELATED APPLICATION(S)

BACKGROUND

1. Field of the Disclosure

The present invention is generally directed to superconductive articles. The invention is particularly related to superconductive articles in the form of coated conductors and devices incorporating the same.

2. Description of the Related Art

Superconductor materials have long been known and understood by the technical community. Low-temperature (low-$T_c$) superconductors exhibiting superconductive properties at temperatures requiring use of liquid helium (4.2 K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has brought potential, economically feasible development of superconductor components incorporating such materials, due partly to the cost of operating such superconductors with liquid nitrogen, rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the native resistance of copper-based commercial power components is responsible for quite significant losses in electricity, and accordingly, the power industry stands to gain significant efficiencies based upon utilization of high-temperature superconductors in power components such as transmission and distribution power cables, generators, transformers, and fault current interrupters. In addition, other benefits of high-temperature superconductors in the power industry include an increase in one to two orders of magnitude of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the challenges associated with the commercialization of high-temperature superconductors, many exist around the fabrication of a superconducting tape that can be utilized for formation of various power components. A first generation of superconducting tape includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of kilometers), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductive layer, typically formed of at least a noble metal. However, to date, numerous engineering and manufacturing challenges remain prior to full commercialization of such second generation-tapes.

Accordingly, in view of the foregoing, various needs continue to exist in the art of superconductors, and in particular, provision of commercially viable superconductive tapes, methods for forming same, and power components utilizing such superconductive tapes.

SUMMARY

According to the first aspect of the disclosed superconductive article, a substrate comprising titanium is provided. A buffer layer overlies the substrate, and a superconductive layer overlies the buffer layer.

Another aspect provides a superconductive article having a substrate, a buffer layer overlying the substrate, a superconductive layer overlying the buffer layer, and a stabilizer layer overlying the superconductive layer. The stabilizer layer comprises aluminum.

Another aspect provides a superconductive article including a substrate having a dimension ratio not less than 10 and a superconductive layer overlying the substrate, wherein the superconductive article has a density not greater than about 7.00 g/cc.

Another aspect provides a superconductive article including a substrate having a density not greater than about 8.00 g/cc, a buffer layer overlying the substrate and a superconductive layer overlying the substrate. Generally, the article has a dimension ratio not less than about 10.

Another embodiment of the device provides a substrate, a buffer layer overlying the substrate, a superconductive layer overlying the substrate, and a stabilizer layer overlying the superconductive layer having a density not greater than about 8.00 g/cc.

DESCRIPTION OF THE PREFERRED EMBODIMENT(S)

Figure 1:
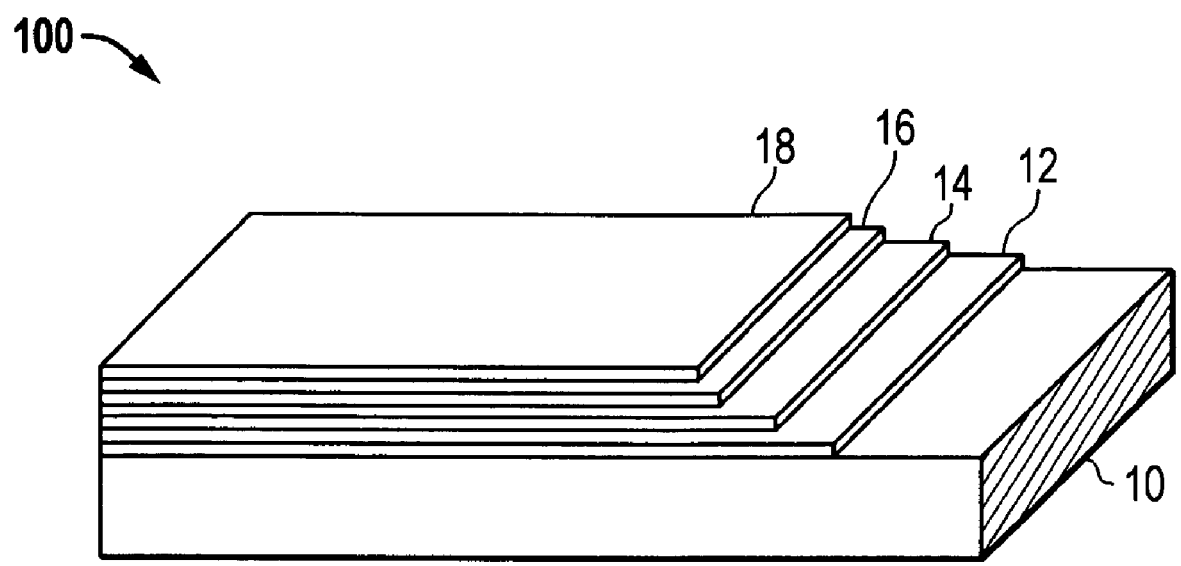
FIG. 1 illustrates a perspective view of the layers of the superconductive article for one embodiment.

FIG. 1 illustrates the layered structure of a superconductive article 100 according to one embodiment. The superconductive article includes a substrate 10, a buffer layer 12, and a superconductive layer 14. A capping layer 16 may be provided overlying the superconductive layer, followed by a stabilizer layer 18 overlying the capping layer 16.

The substrate is generally formed of a material able to withstand the mechanical stress and strain of reel-to-reel processing and may also provide mechanical integrity for the final superconductive article in a variety of applications. Further, the substrate may advantageously withstand high processing temperatures and aggressive processing environments (e.g., highly oxidative) that are utilized during fabrication of the superconductive article. In view of the foregoing, the substrate 10 is generally metal-based, and typically, an alloy of at least two metallic elements. Suitable substrate materials include nickel-based metal alloys such as the known Inconel® group of alloys. Of available materials, nickel-based metal alloys such as the Inconel® group of alloys tend to have desirable creep, chemical and mechanical properties, including coefficient of expansion, tensile strength, yield strength, and elongation. However, in one particular embodiment, the substrate 10 is comprised comparatively lower mass density materials. In this respect, the substrate 10 may have a mass density not greater than about 8.00 g/cc, such as not greater than about 7.00 g/cc or 6.00 g/cc. In some instances the mass density of the substrate is not greater than about 5.00 g/cc.

In the context of low mass density material substrates, use may be made of titanium metal or a titanium metal alloys. Useful alloying metal elements include aluminum, vanadium, iron, tin, ruthenium, palladium, zirconium, molybdenum, nickel, niobium, chromium and silicon, and combinations thereof. Of these, particularly useful alloying elements include aluminum and vanadium. In one embodiment, aluminum and vanadium are present, in amounts not greater than 10% and 8% by weight, respectively, such as not greater than 6% and 4% by weight respectively. One particular species is Grade 9 titanium alloy, containing 3% aluminum and 2.5% vanadium by weight, the balance being titanium. The particular selection of alloying elements may depend upon various factors, including oxidation resistance characteristics.

In the particular context of titanium alloys, the total weight percent of alloying metal elements of the substrate 10 is generally not greater than about 20%, most often not greater than 10% by weight, and the percentage of titanium is not less than about 80% by weight and in other embodiments the titanium is not less than about 85% or 90% by weight. Titanium and titanium alloys desirably provide a substrate having a mass density not greater than about 5.0 g/cc, such as within a range of about 4.0 to 5.0 g/cc.

Further, according to embodiments herein, the substrate 10 may be resistive to enable reduction in eddy current losses in the superconductive layer. Such reduction in eddy current losses is particularly beneficial when the article takes the form of a rotating machine, such as a power generator or motor (further described below). Use of resistive substrates minimizes ac losses when deployed in the form of a rotating machine. Typical resistivities of the substrate are generally greater than about 50 micro-ohm cm, such as greater than about 100 micro-ohm cm.

Further, the thickness of the substrate may be reduced according embodiment while still providing adequate to withstand reel-to-reel processing, handling, and integrity in the field. Typically, the substrate 10 has a thickness not greater than about 50 microns, or even not greater than 40 microns. Still, in other embodiments, the thickness of the substrate 10 may be not greater than about 30 microns or even as thin as about 20 microns or less.

The substrate 10 generally is a tape, having a high dimension ratio. As used herein, the term 'dimension ratio' is used to denote the ratio of the length of the substrate 10 or tape to the next longest dimension, the width of the substrate 10 or tape. For example, the width of the substrate ranges approximately from 0.4–10 cm and the length of the substrate 10 is typically greater than about 100 m, oftentimes greater than about 500 m. Indeed, one embodiment provides for superconductive substrates having a length on the order of 1 km or above, which may comprise multiple tape segments. Accordingly, the substrate may have a dimension ratio which is fairly high, on the order of not less than 10, not less than about $10^2$, or even not less than about $10^3$. Certain embodiments are longer, having a dimension ratio of $10^4$ and higher.

In one embodiment, the substrate 10 is treated so as to have desirable surface properties for subsequent deposition of the constituent layers of the superconductive article. For example, the surface may be lightly polished to a desired flatness and surface roughness. Additionally, the substrate 10 may be treated to be biaxially textured as is understood in the art, such as by the known RABiTS (roll assisted biaxially textured substrate) technique, although generally embodiments herein take advantage of non-textured substrates, particularly including metal alloy polycrystalline substrates.

Turning back to FIG. 1, the illustrated embodiment provides a buffer layer 12. The buffer layer may be a single layer, or more commonly, be made up of several films. Most typically, the buffer layer 12 includes a biaxially textured film, having a crystalline texture that is generally aligned along crystal axes both in-plane and out-of-plane of the film. The biaxial texturing of the buffer layer 12 may be accomplished by IBAD. As is understood in the art, IBAD is acronym that stands for ion beam assisted deposition, a technique that may be advantageously utilized to form a suitably textured buffer layer for subsequent formation of a superconductive layer having desirable crystallographic orientation for superior superconducting properties. Magnesium oxide is a typical material of choice for the IBAD film, and may be on the order or 50 to 500 Angstroms, such as 50 to 200 Angstroms. Generally, the IBAD film has a rock-salt like crystal structure, as defined and described in U.S. Pat. No. 6,190,752, incorporated herein by reference.

The buffer layer 12 may include additional films, such as a barrier film provided in between an IBAD film and the substrate 10. In this regard, the barrier film 12 may advantageously be formed of an oxide, such as yttria, and functions to isolate the substrate from the IBAD film. A barrier film 12 may also be formed of non-oxides such as silicon nitride. Suitable techniques for deposition of a barrier film include chemical vapor deposition and physical vapor deposition including sputtering. Typical thicknesses of the barrier film may be within a range of about 100–200 Angstroms. Still further, the buffer layer may also include an epitaxially grown film, formed over the IBAD film. In this context, the epitaxially grown film is effective to increase the thickness of the IBAD film, and may desirably be made principally of the same material utilized for the IBAD layer such as MgO.

In embodiments utilizing an MgO-based IBAD film and/or epitaxial film, a lattice mismatch between the MgO material and the material of the superconductive layer may exist. Accordingly, the buffer layer 12 may further include another buffer film, this one in particular implemented to reduce a mismatch in lattice constants between the superconductive layer and the underlying IBAD film and/or epitaxial film. This buffer film may be formed of materials such as YSZ (yttria-stabilized zirconia) strontium ruthenate, lanthanum manganate, and generally, perovskite-structured ceramic materials. The buffer film may be deposited by various physical vapor deposition techniques, and generally retains the biaxial texture of the underlying layer on which it is formed.

The superconductive layer 14 is generally in the form of a high-temperature superconductor (HTS) layer. HTS materials are typically chosen from any of the high-temperature superconducting materials that exhibit superconducting properties above the temperature of liquid nitrogen, 77K. Such materials may include, for example, $YBa_2Cu_3O_{7-x}$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The superconductive layer 14 may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment. Typically, the superconductive layer has a thickness on the order of about 1 to about 30 microns, most typically about 2 to about 20 microns, such as about 2 to about 10 microns, in order to get desirable amperage ratings associated with the superconductive layer 14.

The stabilizer layer 18 and capping layer 16 (optional) are generally implemented to provide a low resistance interface for electrical stabilization to aid in prevention of superconductor burnout in practical use. More particularly, stabilizer layer 18 aids in continued flow of electrical current along the superconductive conductor in cases where cooling fails or the critical current density is exceeded, and the superconductive layer becomes non-superconductive. The capping layer 16 may be incorporated in the structure particularly for those embodiments where undesirable interaction between the superconductive layer 14 and the stabilizer layer 18 would otherwise take place. In such cases, the capping layer may be formed of a noble metal, such as gold, silver, platinum, and palladium. Silver is typically used due to its cost and general accessibility. The capping layer 16 is typically made to be thick enough to prevent unwanted diffusion of the components from the stabilizer layer 18 into the superconductive layer 14, but is made to be generally thin for cost reasons (raw material and processing costs). Typical thicknesses of the capping layer 16 range within about 0.1 to about 10.0 microns, such as 0.5 to about 5.0 microns. Various techniques may be used for deposition of the capping layer 16, including physical vapor deposition, such as DC magnetron sputtering.

The stabilizer layer 18 is generally incorporated to overlie the superconductive layer 14, and in particular, overlie and directly contact the capping layer 16 in the particular embodiment shown in FIG. 1, although elimination of the capping layer would result in direct contact with the superconductive layer 14 according to an alternate embodiment. The stabilizer layer 18 functions as a protection/shunt layer to enhance stability against harsh environmental conditions and superconductivity quench. The layer is generally thermally and electrically conductive, and functions to bypass electrical current in case of failure of the superconductive layer. It may be formed by any one of various thick and thin film forming techniques, such as by laminating a pre-formed copper strip onto the superconductive tape, by using an intermediary bonding material such as a solder or flux. Other techniques have focused on physical vapor deposition, typically evaporation or sputtering, as well as wet chemical processing such as electroless plating, and electroplating.

Typically, metals such as copper are used for the stabilizer layer 18. However, according to other embodiments, the stabilizer layer utilizes lower density materials, such as materials having a mass density less than about 8.00 g/cc, 7.00 g/cc, or even 6.00 g/cc. Indeed, certain embodiments have stabilizer layers that have a density not greater than about 4.00 g/cc or not greater than about 3.00 g/cc. According to a particular embodiment a comparatively low density conductive metal such as aluminum forms the major component (greater than 50% by weight) of the stabilizer layer 18. For example, the stabilizer layer 18 may be aluminum or an aluminum metal alloy in which aluminum is present in at least about 80% by weight. The use of aluminum not only reduces the density of the stabilizer layer 18, but notably the global density of the superconductive article 100. Use of aluminum-based materials provides for stabilizer layers having desirably low mass densities, such as not greater than about 3.00 g/cc, such as within a range of about 2.00 to 3.00 g/cc.

Typically, the thickness of the stabilizer layer is not less than about 50 microns, oftentimes not less than about 100 microns. Of note, aluminum-based stabilizers may be comparatively thicker than copper-based stabilizers having the same current carrying capability, since aluminum has a higher resistivity than copper. Despite a relative increase in thickness associated with aluminum-based stabilizers, the mass of the superconductor article may still be reduced due to a significant reduction in mass density.

While the density of materials comprising particular layers has been described above, the global density of the entire superconductive article is desirably reduced according to embodiments herein. A less dense superconductive article may be advantageous for rotating machine applications, such as generators, that place a significant force on, for example, a coil of superconductive tape. Accordingly, in some embodiments a global density of the superconductive article may be less than about 7.00 g/cc. While other embodiments make use of global densities less than about 6.50 g/cc, 6.00 g/cc or even 5.00 g/cc. A lower global density is achieved by reducing the density of each of the component layers, notably the substrate and stabilizer layers as previously detailed.

Figure 2:
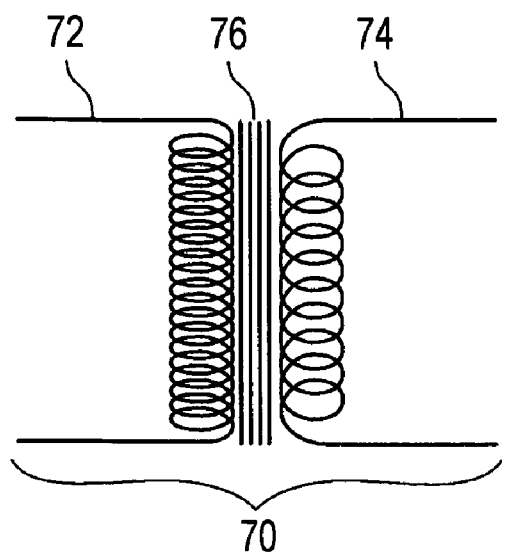
FIG. 2 illustrates a schematic view of a transformer.
Figure 3:
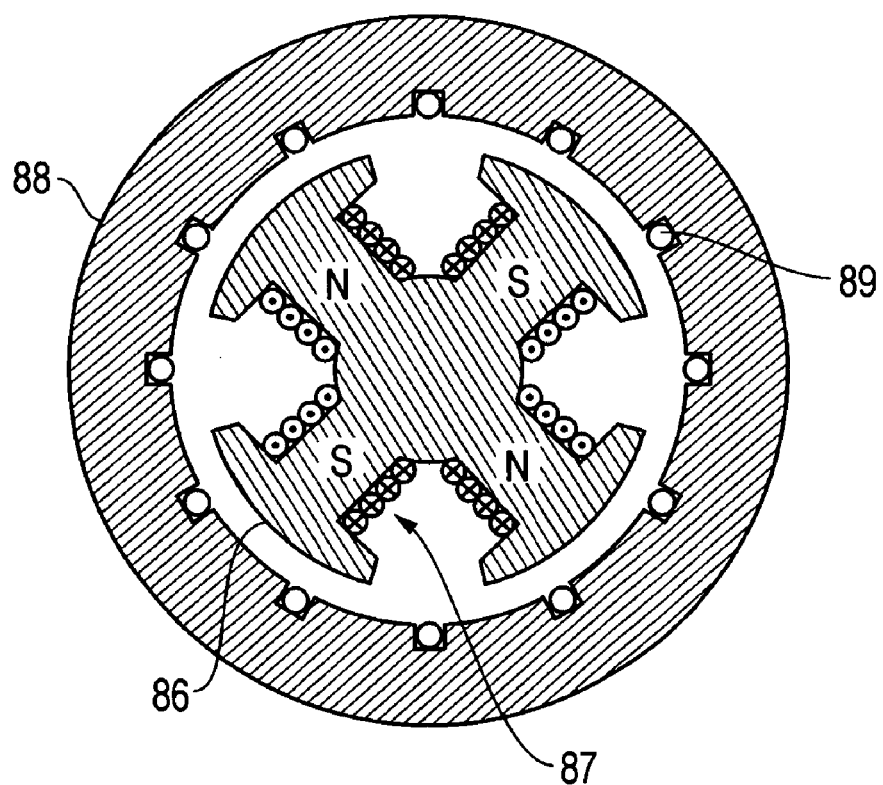
FIG. 3 illustrates a schematic view of a power generator.

While a generalized structure of a superconductor article has been described above in connection with FIG. 1, additional embodiments are illustrated in FIGS. 2 and 3, which show typical applications for a superconductive tape or superconductive article having a high dimension ratio. Beyond the particular architecture and in connection with superconductive articles or tapes as described above in connection with FIG. 1, embodiments are also directed to components, such as industrial or commercial power components incorporating such conductors. Certain classes of such components incorporate coils or windings of high dimension ratio superconductive conductors and are of particular significance. Within the context of coiled or wound architectures, certain embodiments are drawn to a class of power components known as 'rotating machines,' which broadly includes power generators and motors. Such structures implement coiled high dimension ratio superconductive conductors that are rotated at high speeds. Embodiments herein having low density substrates, low density stabilizers, and/or low global density find particular use in such rotating machines.

For example, FIG. 2 illustrates a power transformer having a central core 76 around which a primary winding 72 and a secondary winding 74 are provided. It is noted that FIG. 2 is schematic in nature, and the actual geometric configuration of the transformer may vary as is well understood in the art. However, the transformer includes at least the basic primary and secondary windings. In this regard, in the embodiment shown in FIG. 2, the primary winding has a higher number of coils than the secondary winding 74, representing a step-down transformer that reduces voltage of an incoming power signal. In reverse, provision of a fewer number of coils in the primary winding relative to the secondary winding provides a voltage step-up. In this regard, typically step-up transformers are utilized in power transmission substations to increase voltage to high voltages to reduce power losses over long distances, while step-down transformers are integrated into distribution substations for later stage distribution of power to end users. At least one of and preferably both the primary and secondary windings comprise superconductive tapes in accordance with the foregoing description.

Turning to FIG. 3, a schematic illustration of a generator is provided. The generator includes a rotor 86 that is driven, as is known in the art, by a turbine. Rotor 86 includes high-intensity electromagnets, which are formed of rotor coils 87 that form the desired electromagnetic field for power generation. The generation of the electromagnetic field generates power in the stator 88, which comprises at least one conductive stator winding 89. According to a particular feature, the rotor coils 87 and/or the stator winding 89 comprises a superconductive article in accordance with embodiments described above.

According to various embodiments described above, superconductor articles having desirable mass density characteristics are provided. Such superconductor articles may provide improved mechanical integrity and robustness, particularly when used in highly dynamic environments such as rotating machines, at least partially due to the reduced mass density of the articles.

While particular aspects of the present invention have been described herein with particularity, it is well understood that those of ordinary skill in the art may make modifications hereto yet still be within the scope of the present claims. The previously mentioned embodiments and examples, in no way limit the scope of the following claims.

What is claimed is:

1. A superconductive article comprising:
    a titanium alloy substrate having a dimension ratio is not less than 10, a resistivity not less than about 100 micro-ohm cm, and titanium as the major component, wherein the substrate has a thickness not greater than about 50 microns;
    a buffer layer, the buffer layer comprising at least one film comprised of biaxially aligned crystals both in-plane and out-of plane of the film;
    a superconductive layer overlying the buffer layer, wherein the superconductive article has a density not greater than about 7.00 g/cc.

2. The superconductive article of claim 1, wherein the titanium alloy further comprises an element selected from the group consisting of aluminum, vanadium, iron, tin, ruthenium, palladium, zirconium, molybdenum, nickel, niobium, chromium and silicon, and combinations thereof.

3. The superconductive article of claim 1, wherein the superconductive article has a density not greater than about 6.50 g/cc.

4. The superconductive article of claim 3, wherein the superconductive article has a density not greater than about 6.00 g/cc.

5. The superconductive article of claim 1, further comprising a stabilizer layer overlying the superconductive layer, wherein the stabilizer layer comprises aluminum and aluminum is the major component.

6. The superconductive article of claim 1, wherein the superconductive layer comprises a high temperature superconductor material, having a critical temperature $T_c$ not less than about 77° K.

7. The superconductive article of claim 1, wherein the superconductive article is a coil of superconductive tape, the coil of superconductive tape comprising the substrate and the superconductive layer.

8. The superconductive article of claim 1, wherein the article is a power transformer, the power transformer comprising at least a primary winding and a secondary winding, wherein at least one of the primary winding and secondary winding comprises a wound coil of superconductive tape, the superconductive tape comprising said substrate and said superconductive layer.

9. The superconductive article of claim 1, wherein the article is a rotating machine, the rotating machine comprising at least one winding, wherein the at least one winding comprises a superconductive tape formed of said substrate and said superconductive.

10. The superconductive article of claim 1, wherein said at least one film comprises an IBAD film having a rock salt-like crystal structure.

11. The superconductive article of claim 10, wherein the IBAD film comprises IBAD MgO.

12. The superconductive article of claim 4, wherein the superconductive article has a density not greater than about 5.00 g/cc.

13. The superconductive article of claim 12, wherein the superconductive article has a density not greater than about 4.50 g/cc.

14. The superconductive article of claim 1, wherein the superconductor material comprises $REBa_2Cu_3O_{7-x}$, wherein RE is a rare earth element.

15. The superconductive article of claim 1, wherein the article has a dimension ratio not less than about 100.

16. The superconductive article of claim 1, wherein the stabilizer layer has a thickness not less than about 50 microns.

* * * * *